United States Patent [19]
Baxter

[11] Patent Number: 4,980,577
[45] Date of Patent: Dec. 25, 1990

[54] DUAL TRIGGERED EDGE-SENSITIVE ASYNCHROUNOUS FLIP-FLOP

[75] Inventor: Michael A. Baxter, Sunnyvale, Calif.

[73] Assignee: Advanced Micro Devices, Inc., Sunnyvale, Calif.

[21] Appl. No.: 356,572

[22] Filed: May 23, 1989

Related U.S. Application Data

[63] Continuation of Ser. No. 63,621, Jun. 18, 1987, abandoned.

[51] Int. Cl.$^5$ ............................................. H03K 0/37
[52] U.S. Cl. ................................. 307/272.1; 307/291; 307/518; 307/445; 307/443
[58] Field of Search ................... 307/272.1, 272.2, 291, 307/292, 471, 480, 514, 516, 525–528, 238.6, 465, 269, 518, 445, 443; 328/133, 134, 206

[56] References Cited

U.S. PATENT DOCUMENTS

| | | | |
|---|---|---|---|
| 3,971,960 | 7/1976 | Means et al. | 307/291 |
| 3,976,949 | 8/1976 | Hepworth et al. | 307/279 |
| 4,178,554 | 12/1979 | Sase et al. | 307/514 |
| 4,282,489 | 8/1981 | DeRienzo | 307/291 |
| 4,300,060 | 11/1981 | Yu | 307/272.2 |
| 4,544,850 | 10/1985 | Tarleton | 307/528 |
| 4,562,427 | 12/1985 | Ecton | 307/465 |
| 4,591,737 | 5/1986 | Campbell | 307/272.2 |
| 4,607,173 | 8/1986 | Knoedl, Jr. | 307/291 |
| 4,835,422 | 5/1989 | Dike et al. | 328/133 |
| 4,841,178 | 6/1989 | Bisson | 307/514 |
| 4,893,028 | 1/1990 | Beltramini | 307/291 |
| 4,894,557 | 1/1990 | Beltramini | 307/291 |

FOREIGN PATENT DOCUMENTS 0154330 9/1985 European Pat. Off. ......... 307/238.6

Primary Examiner—Stanley D. Miller
Assistant Examiner—Tai V. Duong
Attorney, Agent, or Firm—Skjerven, Morrill, MacPherson, Franklin & Friel

[57] ABSTRACT

An architecture for bistable circuits with minimized sensitivity to metastability events and with improved operation in signal timing, arbitration, and protocol applications. Conventional edge-triggered flip-flops require input signals to remain present during certain set-up and/or hold time intervals on an input line "data path" for sampling at an instant determined by a separate synchronization input signal. In contrast, the present invention uses two edge-sensitive input lines which are triggered essentially independently without either being synchronized by or depending upon the other. The flip-flops also have twin, independently operable, level sensitive and selected priority PRESET and CLEAR input lines. The active edge or level polarity is programmable for each input line. Alternate embodiments for complementary classes of asynchronous timing perform specific bistable functions, such as set-reset, or toggle.

11 Claims, 13 Drawing Sheets

DUAL TRIGGERED EDGE-SENSITIVE ASYNCHROUNOUS FLIP-FLOP

This application is a continuation of application Ser. No. 07/063,621, filed June 18, 1987, now abandoned.

BACKGROUND OF THE INVENTION

1. Field of the Invention

This invention concerns digital logic circuits and more particularly bistable circuits protected from metastability conditions in high-speed signalling environments.

2. Description of the Prior Art

In the operation of digital logic systems, externally provided binary signals are received on system input lines and, in selected combinations, applied to various logic elements within the system. Binary signals have two possible opposite direction edge-transitions between two possible steady level phases, the time order of which is the mechanism for distributing timing or data signal intelligence to elements within a logic system. Temporary values are transformed by receiving logic elements in combination with other signals to produce output signals to drive succeeding logic elements. Binary signals may be switching between the two valid levels when sampled at an instant determined by a second signal, yielding an ambiguous sample value which can cause metastability in, or otherwise impair the operation of, receiving elements. Circuit paths of various lengths and complexities impose different delays in propagating signals, making it difficult for circuit designers to ensure that signals propagating through distinct paths will arrive at specified nodes in specified sequences, and remain stable long enough for receiving elements to respond correctly. To prevent different propagation delays from causing erroneous logic states, logic systems generally control signal propagation sequences and durations by bistable memory elements or "flip-flops" employed at appropriate check points of the circuit. When stimulated by an input signal, a flip-flop samples and holds the input signal value on the flip-flop output line, until other flip-flop input signal conditions change. Signal regulation by flip-flops helps satisfy timing constraints within systems. The signal reception time uncertainty problem is assumed by the flip-flops, and largely relieved for succeeding logic elements. Avoidance of flip-flop metastability and achievement of correct system switching operation correctness depend on switching protocol and time interval constraints, and flip-flop mechanisms.

In synchronized or "locally synchronous" circuits, signal timing and switching are controlled by a central-timebase (local to the immediate surrounding circuitry) providing clock signals to enable or trigger flip-flops to sample input signals, which the flip-flops hold as output signals during a time interval to "set-up" input lines in succeeding ranks of flip-flops, in preparation for being sampled at the next clock pulse. There may also be a "hold time" requirement such that sampled input signals must not change for a brief time after the clock pulse. These set-up and hold time constraints limit synchronized circuit speed.

In contrast, there is no local or central timebase for "locally asynchronous" circuits, in which timing and data information are contained in signal sequences received from associated systems. Switching events are time-separated by minimum intervals defined for the system, and these switching events often contain implied recoverable timing information as well as data.

Logic elements controlled by a common timebase operate synchronously with respect to each other, yet operate asynchronously with respect to other logic elements not controlled by the common timebase, regardless of whether the other elements are controlled by other clocks. Signal timing control ends at the boundary of both synchronous and asynchronous systems, which must relate their timing to the timing of any relatively asynchronous transmitting circuit in order to receive signals from that transmitter. Local synchronization is subject to metastability in interfacing to other locally synchronous subsystems, or when edge-event inputs cannot be prevented from occurring simultaneously or which occur unrecoverably.

Digital subsystem signal communication can be examined wherever two subsystems interact. Maintaining the stability of logic system switching becomes more difficult as the number of independently-timed sequential logic subsystems increases. In modern systems, the tendency is to have many interacting subsystems comprising a system. Essentially, this means that the signalling synchronization loses precision and becomes more asynchronous. The totality of a system comprised of constituent subsystems may be considered to be hierarchically organized. As signals are exchanged across subsystems, various layers within a system hierarchy are stimulated.

Many digital systems include both local nodes (within a few feet), as well as possibly quite distant nodes (in spacecraft millions of miles away). Various interconnecting media such as wires, radio waves and optical carriers used within hierarchically organized systems (with complex digital subsystems) exhibit timing problems in clocked flip-flops used where subsystems exchange signals. Complex multilevel or hierarchical signalling protocols require additional decisions, and often result in increased ranking of flip-flops within the various subsystems. Hierarchical subsystem nodes are each analogous to independent locally synchronized systems as described above. Hierarchical system levels may be classified according to constraints (FIGS. 1 and 2a, 2b) upon the relative time-order alignments of the signal edges.

In "rigidly asynchronous" signalling, FIG. 1, signal edges are caused by other edges without explicit synchronization to a particular timebase, but signal edge relative alignments are constrained to be spaced over some range of time. A "granular" asynchronous signalling protocol defines how to assemble edge transition events to form intelligence-bearing signal groups, but does not necessarily dictate signal group spacings, which may be irregular.

In the FIG. 1 example of rigidly asynchronous signalling, a Sender and a Receiver exchange data packets according to a four-edge signalling protocol. The Sender signals on assertive-low request line $\overline{REQ}$ to the Receiver, and the Receiver signals on assertive-low acknowledge line $\overline{ACK}$ to the Sender. Signalling cycles 1 and 2 are made up of individual time intervals Tax, Tbx, and Tcx, which may all be different and are all larger than some minimum time and larger than 0 but also not larger than some maximum time. Ta1, Tb1, Tc1 comprise the total time interval Tcycle #1 whereas Ta2, Tb2 and Tc2 comprises the total time interval Tcycle #2. The intervals Tax, Tbx, Tcx are subject only to the aforementioned constraints which means that total time intervals of a complete cycle in general are not necessarily of equal duration yet all are separated by a time Tw greater than 0. The rigidly asynchronous constraint that signals be time-separated by minimum and/or maximum time-windows requires rapid-response flip-flops. Rigidly asynchronous signalling is used in backplane bus handshake-control protocols, serial data communications disciplines, and local area network (LAN) protocols.

Referring to FIGS. 2a and 2b, in "fully asynchronous" signalling protocols, signal edges are caused by other signal edges, undergo transitions or "recycle" no faster than at a rate Tp−1, last at least minimum times at HIGH (TpwH) and LOW (TpwL) levels, and may be assembled as defined by the protocol to form groups of intelligence-bearing signals. Fully asynchronous signalling does not constrain relative phase alignments and spacing Tbefore and Tafter of received signals relative to local signals. A given subsystem or node receives asynchronous signal edges randomly or uncontrollably, possibly coincidentally with receipt of local synchronizing signals, and may jitter around edges in a local synchronizing signal.

Fully asynchronous signalling is illustrated in the FIG. 2a example of received signal synchronization. A constant-frequency timebase "Synch" clock samples "Asynch" data signals, in which edge-event times are not constrained. FIG. 2b illustrates arbitration of which is first between two fully asynchronous negative edge Request lines, $\overline{REQ1}$ and $\overline{REQ2}$. Each Request line is constrained according to the rigidly asynchronous protocol, but two or more request lines acting simultaneously upon a single element encounters the problems of how relatively to compare the two signal edges, and what to do if the two signal edges appear simultaneously. Arbitration is an implicitly edge-driven hierarchy, in which one signal edge-event is weighed over another, requiring flip-flops to be sensitive to possibly very brief intervals approaching or even equaling zero between edge-events. The relative timing or alignment of active phases of signals can cause conventional flip-flops to miss signal edges, produce insufficiently wide output pulses, or succumb to metastability.

Fully asynchronous signalling is applied in interrupt and direct memory access (DMA) requesters and signal synchronizers in communication and backplane buses; in timing recovery circuits in magnetic or optical storage media; and in digital edge-based phase comparators.

To contend with metastable conditions caused by input signal values changing or conflicting at the moment of sampling, some conventional flip-flops stabilize metastable values between an input stage and an output stage. In a master-slave flip-flop, a clock signal enables an input master stage to produce an intermediate signal, in which possible metastable values are expected to settle before the intermediate signal is transferred to an output slave stage when the slave is enabled (by a subsequent phase of the clock). However, delaying metastable intermediate signals between stages does not guarantee that by the end of a finite delay metastable conditions will be resolved.

U.S. Pat. No. 4,398,105 discloses a flip-flop arbiter circuit in which input stage intermediate output signals having metastable values are detected by a difference detector which disables an output stage from passing the intermediate signals until metastable values have settled.

Using sequential circuits to combine multiple signals into an input signal and to stabilize the input signal value before applying the input signal to a flip-flop delays the flip-flop response to the multiple signals. U.S. Pat. No. 3,917,961 reduces this delay by using separate master-input stages to receive and stabilize each input signal, and by combining the master-stage outputs in a wired OR connection to produce an intermediate signal for application to a single slave-output stage. However, conflicting outputs from the master stage can still cause a metastable intermediate signal, which may be transferred through the slave stage to the flip-flop output line.

U.S. Pat. No. 4,045,693 discloses an RS flip-flop with output lines fed back through an input network to block redundant input signals from reasserting the existing state of the flip-flop, and to pass an input signal edge asserting the alternate state. However, this does not relieve the problem of an input signal changing just as the input network enables the input, causing metastability in the flip-flop.

In both rigidly and fully asynchronous signalling environments, the problems of using flip-flops for signal synchronization, arbitration, and backplane bus timing and protocol logic requires stable circuit operation without adding excessive logic elements for reception of edge-events. Several constraints result from these needs. Sufficient timing margins must be ensured, susceptibility to metastability-causing events must be minimized or avoided, important edge-events cannot be missed, and nodes internal to a system element should not generate spurious or insufficiently narrow pulses. These problems establish a need for an architecture for bistable devices to respond to asynchronous signal events more quickly, with fewer time constraints than previous architectures, and with improved predictability in a variety of edge event stimuli.

SUMMARY

The previously developed system problems caused by internal flip-flop circuit timing constraints and the susceptibility for metastability due to these constraints are relieved by the present invention. In conventional flip-flops these constraints arise from internal circuit architecture involving the paths through which data flows in relation to a secondary timing signal. In the present invention, by removal of this "data path" constraint, a "datapathless" bistable architecture results in alternate embodiments optimized to sense signal edge events in various asynchronous phase relationships with other signals. Two asynchronous input signals are received and detected independently, directly, and immediately, rather than indirectly through a conventional "data path" which sampling signals at times depending upon a secondary resynchronizing signal. The present invention is embodied in two complementary flip-flop circuits, each having preferably four asynchronous input lines. One embodiment is optimized for "rigidly asynchronous" time-separated signalling environments, and the other embodiment is optimized for "fully asynchronous" time-independent signalling environments. Each embodiment includes, for each of two edge-sensitive input lines, an input stage which detects the active edge phase of the respective asynchronous input signal, to produce an intermediate bistable signal, the two intermediate signals are then combined by an output stage to produce a selected bistable function of the two edge-input signals. In addition, because most modern systems consist of hierarchically arranged subsystem elements, the invention provides an additional pair of priority-weighted asynchronous level-sensitive inputs. Either or both of these level-sensitive inputs predictably preempt responses to the twin edge-sensitive input lines, which provides a hierarchical switching functionality optimally suited for relieving the aforementioned system problems.

Where the selected bistable storage mode includes an output stage performing a sequential logic function, in which metastability could result from incompatible active phase input signals, several safeguarding means may be employed: an input network to block potentially metastable-causing input signals from reaching the input stages; having an active-phase input signal disable the responding input stage until the input stage is re-enabled later by the alternate input stage; or through the level-sensitive priority weighted preemption inputs that are used simultaneously with the edge-sensitive lines. The present invention offers speed, efficiency, and improved metastability characteristics over prior art devices used in asynchronous signalling environments.

DETAILED DESCRIPTION

Figure 1:
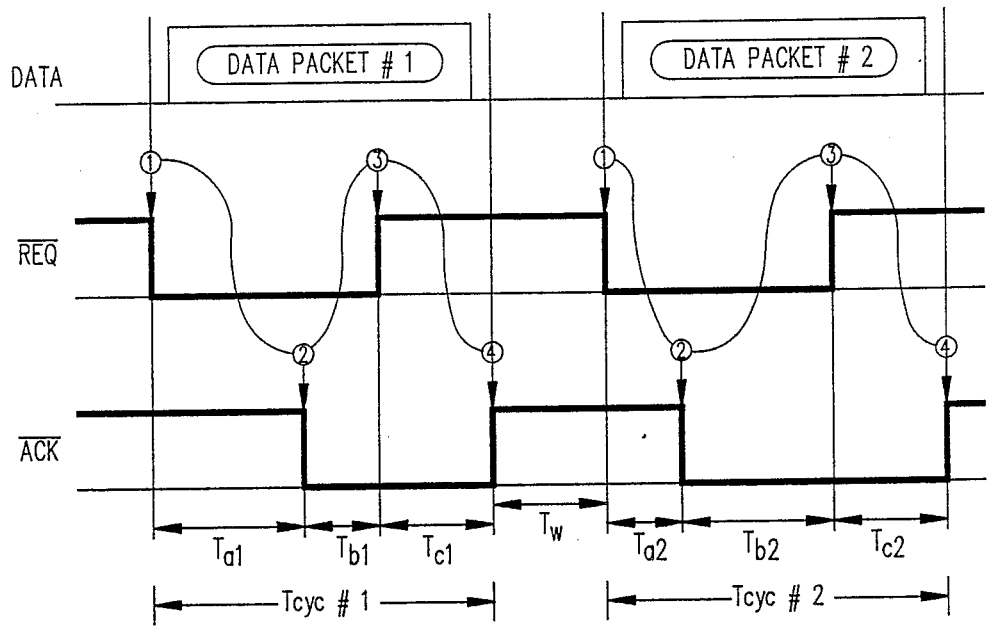
FIG. 1 shows two rigidly asynchronous signal waveforms $\overline{REQ}$ and $\overline{ACK}$ with edges constrained to be time-separated.
Figure 2A:
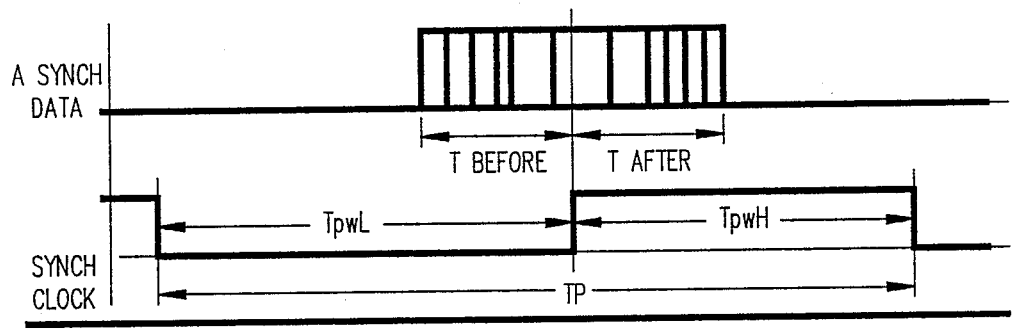
FIGS. 2a and 2b show pairs of two fully asynchronous signal waveforms (Asynch data and Synch clock in FIG. 2a, or $\overline{REQ1}$ and $\overline{REQ2}$ in FIG. 2b) in which edges are unconstrained relative to each other and can occur at any instant.
Figure 2B:
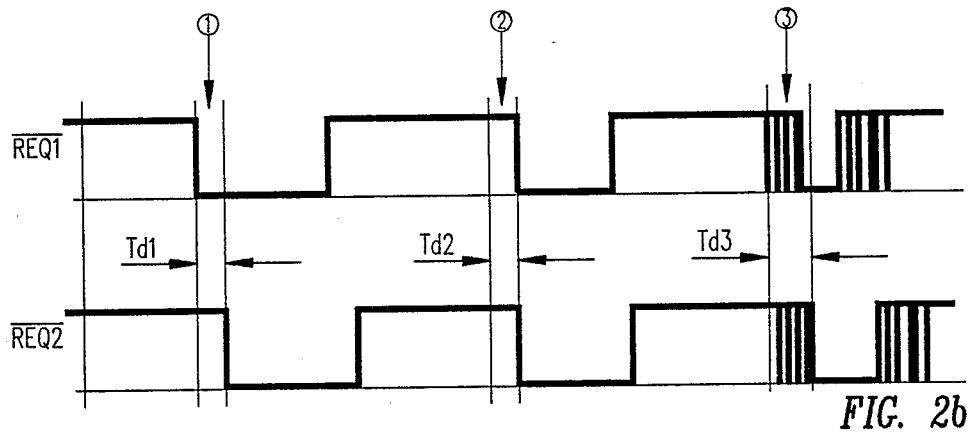
Figure 3:
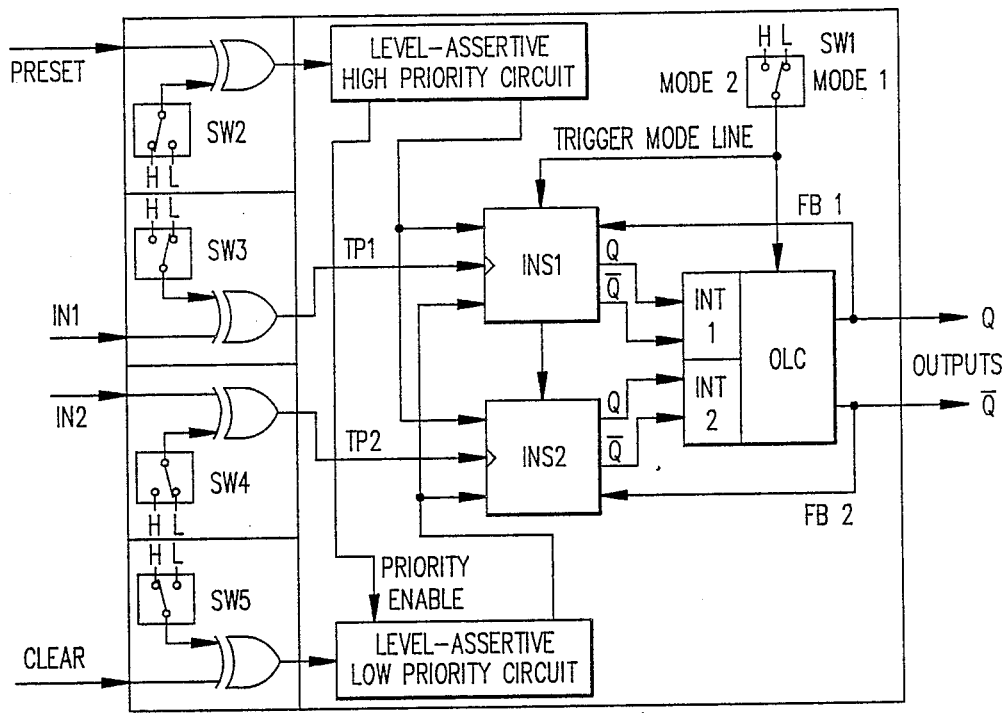
FIG. 3 is a block diagram of the generic architecture of the invention.
Figure 6:
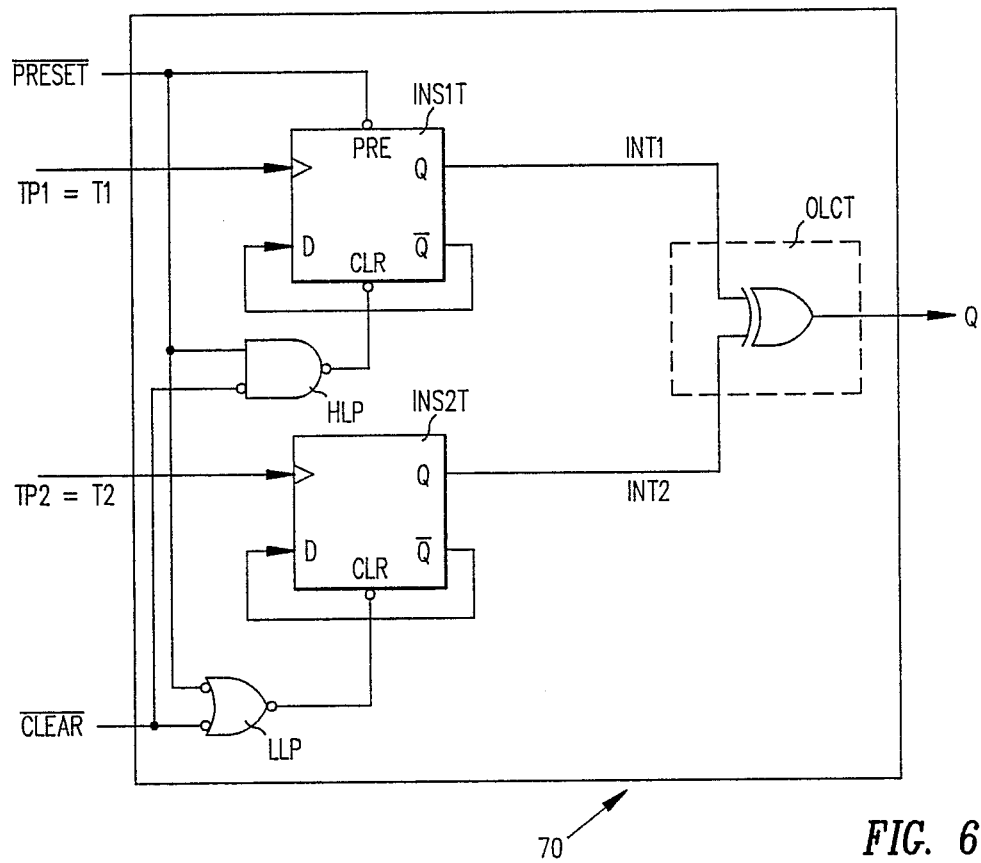
FIG. 6 shows the 2T embodiment in a circuit using D-type flip-flops for input stages INS1T and INS2T and further showing an exclusive-OR (XOR) gate as a memory-less output stage OLCT.
Figure 13:
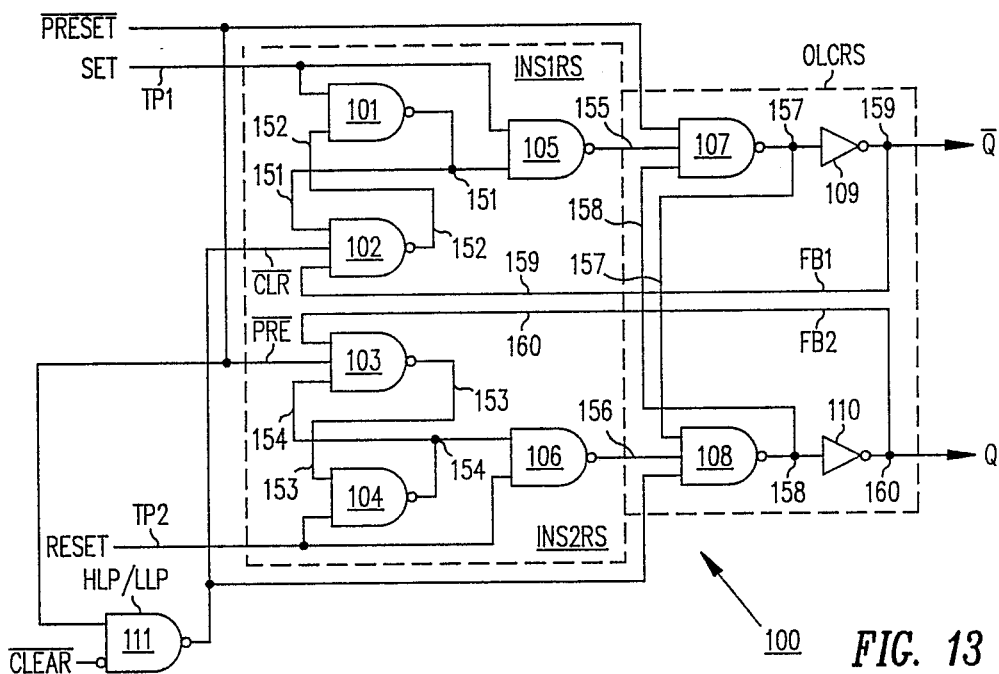
FIG. 13 shows the RS embodiment in a gate level circuit.

The present invention provides a generic architecture, FIG. 3, for data pathless dual-trigger bistables 80, embodied in alternate and complementary flip-flop circuits, FIGS. 6 and 13, optimized for efficient sensing in each of the rigidly and fully asynchronous signalling environments, respectively.

Referring to FIG. 3, the architecture comprises five functional elements: an "edge-triggered bistable and mode logic circuit path 1" (INS1), an "edge-triggered bistable and mode logic circuit path 2" (INS2), an "output logic circuit" (OLC), a "level-assertive high-priority circuit" (HPC), and a "level-assertive low-priority circuit" (LPC). The functional elements are preferably controlled by elements SW1, SW2, SW3, SW4, and SW5.

The invention in each embodiment provides a respective input stage INS1 and INS2 for each of the edge-sensitive trigger input signal lines IN1 and IN2. Input stages INS1 and INS2 are directly sensitive to active edge signals on respective input trigger paths TP1 and TP2 without using a conventional second synchronizing signal for time sampling of the asynchronous input signal. The "data pathless" architecture is indicated by trigger paths TP1 and TP2 remaining separate through input stages INS1 and INS2 and into the OLC. Because input line samples are not subject to sample resynchronization, flip-flops according to the invention have no input "set up" time (Tsu) or "hold" time (Th), as compared with conventional flip-flops. Input stages INS1 and INS2 do not directly affect each other's input response, and are insensitive to non-active phases of input signals. Output stage OLC provides a "true" output line Q and a complementary output line $\overline{Q}$.

The "bistable storage mode" (BSM) of each embodiment is the particular edge-based switching functionality resulting from stimuli at the IN1 and IN2 inputs as shown in FIG. 3.

Figure 4:
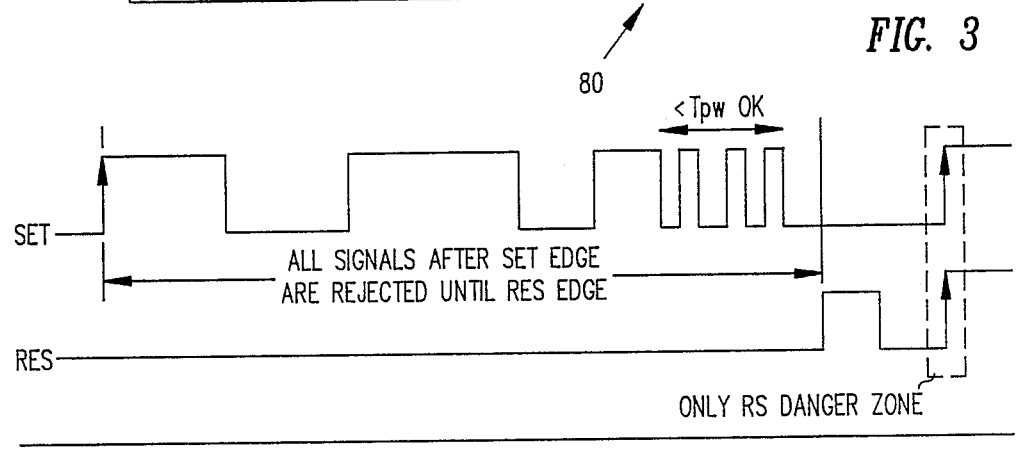
FIG. 4 shows how asynchronous signals are either time independent or constrained as time-spaced.
Figure 4:
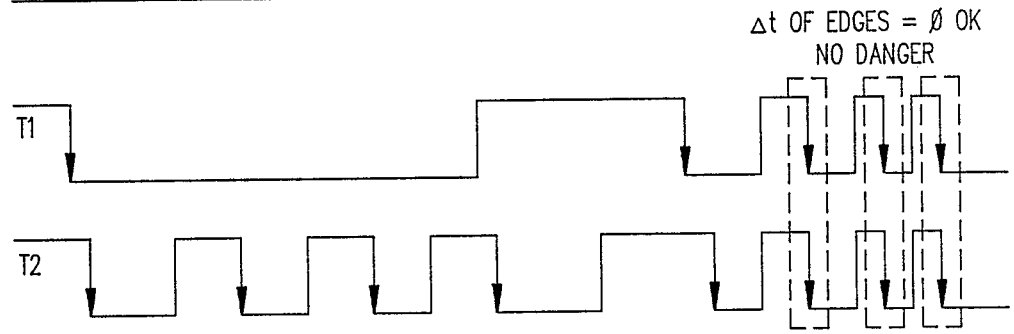

Referring to FIG. 4, the first embodiment has a BSM optimized for time-separated signalling in rigidly asynchronous environments, and a second embodiment has a BSM optimized for time-independent signalling in fully asynchronous environments.

For signalling in the time-separated mode, output stage OLC FIG. 3, or OLCRS, FIG. 13, uses feedback lines FB1 and FB2 to logically connect either (input stage INS1) intermediate line INT1 (FIG. 3, or line 155, FIG. 13) or (input stage INS2) intermediate line INT2 (FIG. 3, or line 156, FIG. 13) to the input lines of the OLC (or OLCRS, FIG. 13) in an embodiment functioning as an RS flip-flop. An active edge, when received, causes the enabled input stage INS1 or INS2 to switch the flip-flop 80 output signal Q, disable itself, and enable the alternate input stage INS2 or INS1 which can then respond to an active edge of the respective input TP2 or TP1. The disabled input stage rejects subsequent edges and thereby reduces the possibility of causing metastability in the flip-flop 80. The data pathless architecture and decoupling between input stages INS1 and INS2 advantageously minimizes the time needed between activating alternate inputs IN1 or IN2, hence allows extremely rapid recycling of active inputs.

Figure 8:
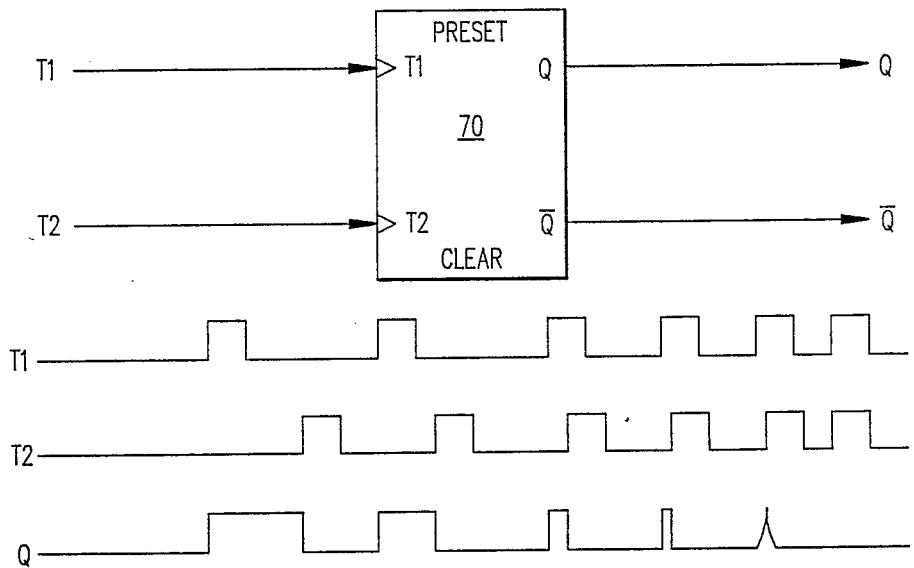
FIG. 8 shows how the 2T flip-flop combines fully asynchronous inputs without producing metastable outputs.
Figure 9:
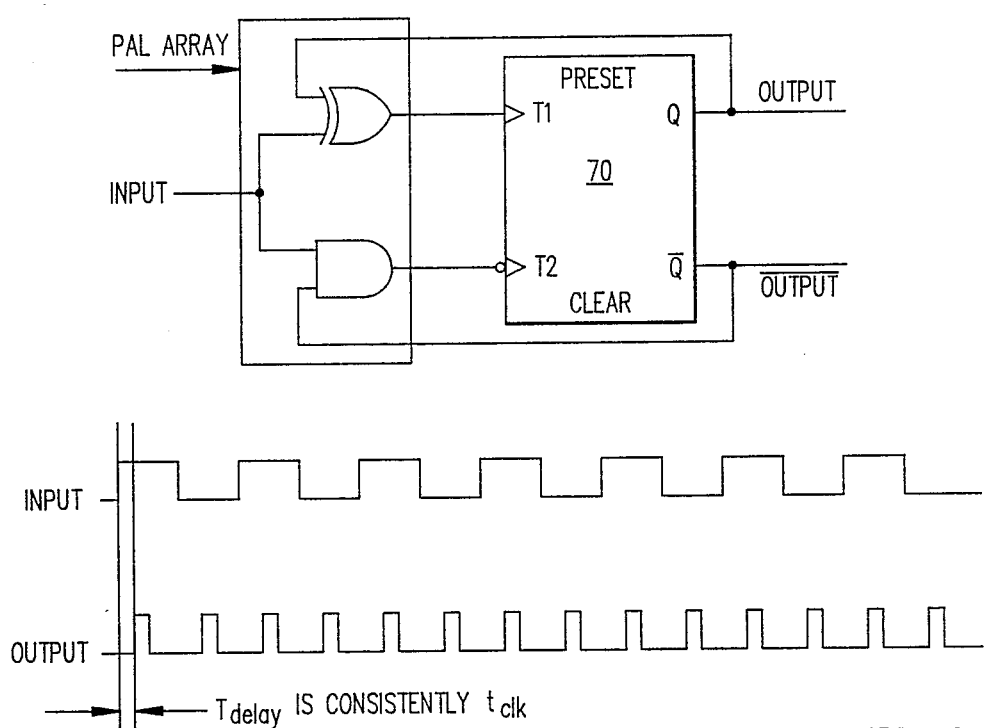
FIG. 9 shows the 2T flip-flop in an application as a clock doubler.
Figure 10:
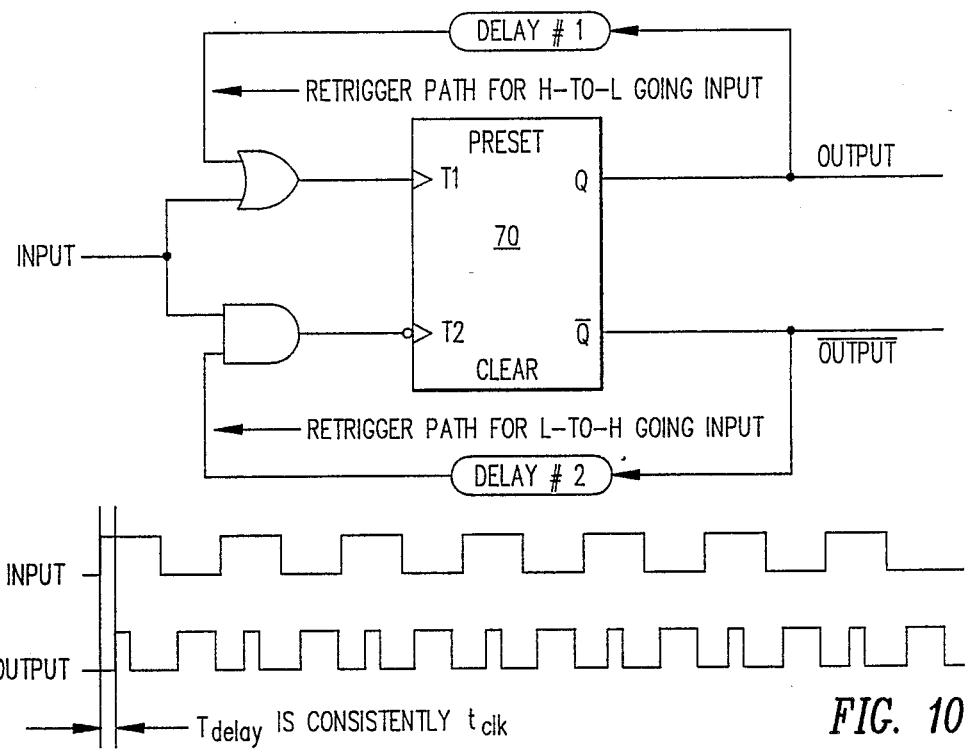
FIG. 10 shows the 2T flip-flop in an application as a phase differentiator.
Figure 11:
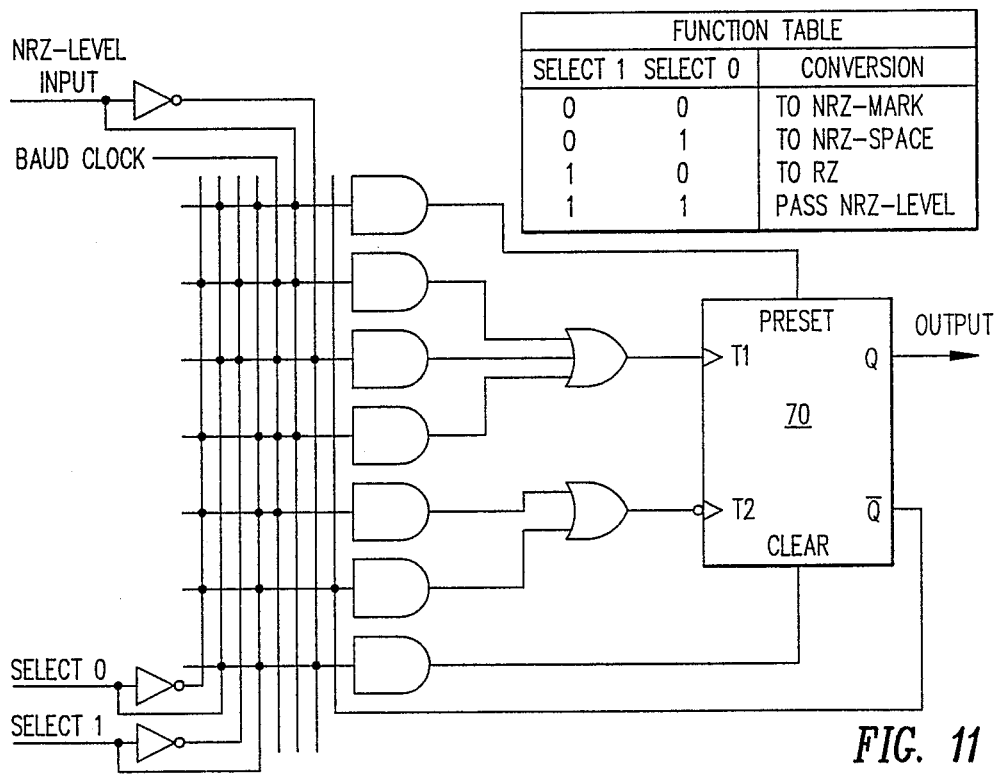
FIG. 11 shows example of NRZ-RZ protocol sequences.
Figure 12:
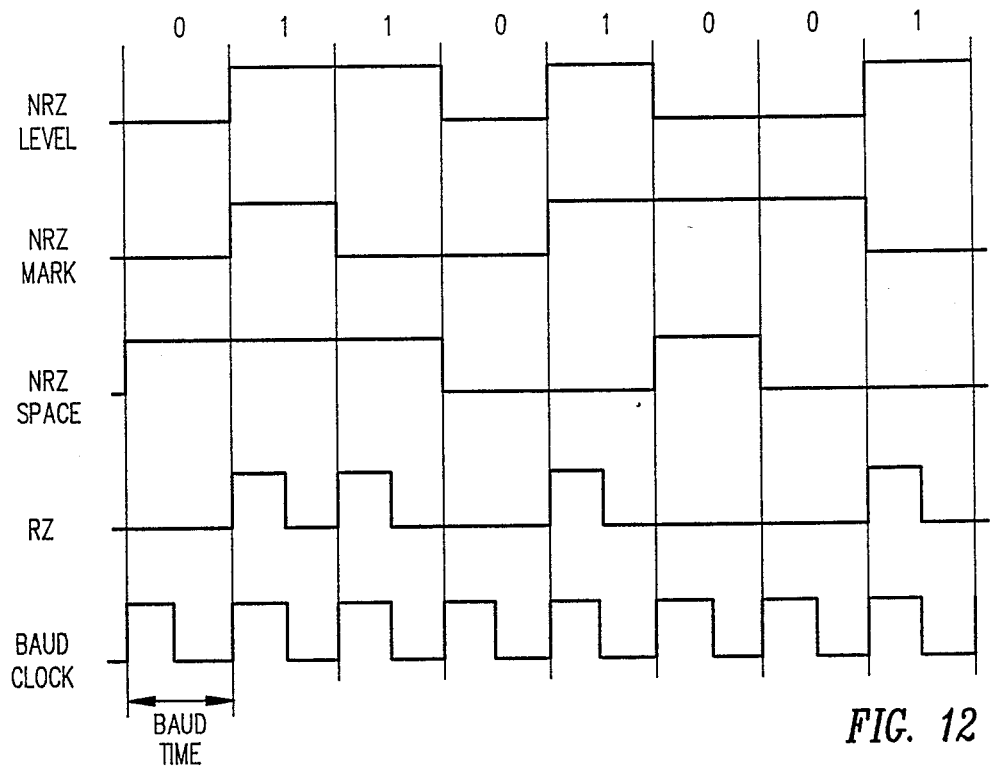
FIG. 12 shows the 2T flip-flop combined with a programmable logic input (PLA or PAL ®) network.

In the time-independent mode for fully asynchronous signalling, FIG. 6, input states INS1T and INS2T do not interfere with each other through their intermediate line INT1 and INT2 connections to control the OLCT, which is a combinatorial rather than sequential circuit, in an embodiment of the invention as a twin toggle 2T flip-flop 70. INS1T and INS2T switch independently (e.g. "without memory") of, their connection by lines INT1 and INT2 to the OLCT. Active edge-events are allowed to occur without regard to their relative phase-alignments, at any time, at either input line. Any active edge-event at either input T1 (to stage INS1T) or input T2 (to stage INS2T) immediately causes the OLCT to reverse or "toggle" the flip-flop output signal Q (FIG. 8). The 2T dual triggered flip-flop 70, receiving two simultaneously active edges, transparently double-toggles. The twin edge-sensitive input paths TP1 and TP2 are isolated from and independent of each other, and since neither depends upon the other, the 2T flip-flop 70 is never subject to metastability. As long as input pulses are each wide enough to trigger their respective input stage INS1 or INS2, the minimum time between logically valid output signals Q can be as little as 0, which allows exceedingly rapid recycling of active inputs.

As pictured in FIG. 3, the RS and 2T BSM's are distinguished by the complementary internal control mechanism used to achieve the particular BSM. In the RS embodiment, the OLC of FIG. 3 is the chief controlling mechanism for switching the assertive edge sensitive functionality between INS1 and INS2. The 2T embodiment, however, uses the INS1, and INS2 blocks of FIG. 3 in providing the chief control mechanism over the OLC for this BSM.

The invention preferably, and consistently in any embodiment, FIGS. 3, 5, 6 and 13, also has two level-assertive input lines $\overline{\text{PRESET}}$ and $\overline{\text{CLEAR}}$, with a selected one having priority over the other, which, when asserted either individually or jointly, preempt or "lock out" any and all active edges at either edge-sensitive input IN1 or IN2, and while being asserted, continue to preempt any simultaneously occurring edge-events. The $\overline{\text{PRESET}}$ and $\overline{\text{CLEAR}}$ inputs may be asserted or unasserted in any desired combination, including simultaneously. The twin edge-sensitive inputs IN1 and IN2 in FIG. 3 supplemented with the priority-weighted preemptive level sensitive inputs provide an architecture with increased responsiveness to hierarchical input signals sequences. Control over all input path active signal polarities provides the BSM in several configurations with the collective capability of sensing edge-events in all asynchronous signalling environments. In order for asynchronous active phases to be sensed directly by the flip-flop, input signals IN1, IN2, PRESET, and CLEAR are passed through programmable polarity control elements, which are shown for the sake of clarity in FIG. 3 as switches with exclusive-or (XOR) gates, but which preferably comprise fuse programmed product terms, electrically programmed storage cells, light-controlled storage cells, or metal or polycrystalline silicon lines in an automatically routed gate array or other (user-or factory-programmed) AND-OR-INERT (AOI) logic arrangement or other application specific integrated circuit (ASIC). In different embodiments, and as favored by various technologies of semiconductor fabrication, the BSM may be programmable (once) or reprogrammable by SW1, FIG. 3. Stages IN1, IN2, and OLC are preferably in generic embodiments. In the specific RS (FIG. 13) and 2T (FIG. 6) embodiments, OLC is illustrated with fixed functionality. The twin edge triggered inputs may be functionally preceded by AND-OR programmable array logic product terms as in U.S. Pat. No. No. 4,124,899, assigned to the assignee of this invention.

The FIG. 5 RS and 2T flip-flop logic symbols as used in the following tables and applications exhibit the switching functionality and capabilities of the architecture 80. In the dual-triggered RS flip-flop, FIG. 13, edge sensitive trigger path TP1 is a SET input line, and TP2 is a RESET input line. Active triggering the SET input line sets the output Q to logic HIGH, or 1, whereas active triggering the RES input line resets output Q to LOW or 0. The PRESET and CLEAR input line bubbles (FIG. 5) indicate unprogrammed default active-LOW levels, either or both of which, if desired, can be programmed as active-HIGH. Further, the programming of the active level can be achieved by customization via programmable array logic device product terms as in U.S. Pat. No. No. 4,124,899. In addition the unprogrammed default active low levels are beneficial in that a single AND product term allows multiple inputs as used in a PAL device due to the ability to perform De Morgan expansion.

Figure 5:
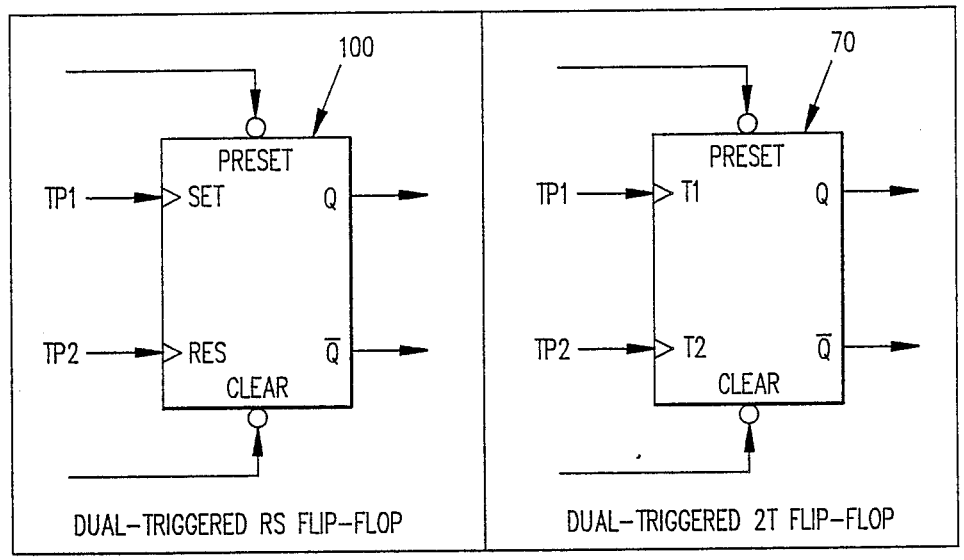
FIG. 5 shows the invention in block diagram embodiments as an RS flip-flop and as a 2T flip-flop.

In the FIG. 5 and 6 dual-triggered 2T flip-flop 70, edge-sensitive trigger path T11 is a toggle input T1, and trigger path TP2 is a toggle input T2. In the unprogrammed default state, a positive-edge at input line IN1 and hence T1 causes output bits Q and $\overline{Q}$ to toggle (e.g. reverse), and independently of the T1 signal phase, a positive-edge at input line IN2 and hence T2 concurrently toggles the flip-flop output bits Q and $\overline{Q}$.

Table I shows symbols used in tables developed subsequently for various types of possible asynchronous switching functionality in illustrating example BSM's of the invention.

TABLE I
SYMBOLOGY FOR ASYNCHRONOUS SWITCHING

L = Steady logic Zero
H = Steady logic One
↑ = Positive-edge transition
↓ = Negative-edge transition
X = H, or L, unchanging relative to an edge-transition
XE = H, L, or either edge-transition (L−to−H, or H−to−L
XE− = H, L, or negative edge-transition only (H−to−L)
XE+ = H, L, or positive edge-transition only (L−to−H)
$Q_0$, $\overline{Q_0}$ = Flip-Flop states prior to last stimulus Table II shows all potential asynchronous input signal edges and levels, in a hierarchical organization of eight "stimulus behavior groups" representing the major different switching behaviors of the invention in both embodiments.

TABLE II STIMULUS BEHAVIOR GROUPS

I - Disactive stimulation

Disactive Stimulation refers to the realm of steady-state inputs which do not actively cause an output change in the flip-flops. This is distinguished from quasi-disactive stimulation, which, for an application circuit, is typified by an intermediate 'do nothing' state achieved while in transit to a specific active state.

II - Edge-sensitive inputs one-edge events

The set of conditions and flip-flop outputs occurring when only one of the edge-sensitive inputs receives an edge-event input.

III - Edge-sensitive inputs two-edge events

The set of conditions and flip-flop outputs occurring when both of the edge-sensitive inputs receive edge-event inputs.

IV - Static preemption conditions

The set of conditions in which the output of the flip-flop is statically bound to a fixed state due to the input conditions at the preemption inputs of the flip-flop. In this condition the edge-sensitive inputs are completely and totally disabled from causing changes in the flip-flop.

V - Entry to preemption conditions

This is the set of conditions in which one or both of the preemption inputs is first asserted, with possible simultaneously occurring active-phase edge-events. In every case, entry-to-preemption guarantees that activity at the edge-sensitive inputs is universally rejected, in every embodiment. The preemption features offer each flip-flop a hierarchical stimulation capacity.

VI - Leaving preemption in priority H

This is the set of conditions in which the preemption inputs are deasserted, with consequent response of the flip-flop. This case deals with simultaneous deassertions, as well as simultaneously occurring combinations of edge-events at the edge-sensitive inputs. In this case, the flip-flop is left in priority H, via a (arbitrarily) chosen priority schema between the two preemption inputs. As in entry-to-preemption, all activity at the edge-sensitive inputs is universally rejected until a short time after the deassertion of preemption inputs has ceased. In other words, the hierarchical stimulation functionality of preemption inputs over edge-sensitive inputs, is maintained.

VII - Leaving preemption in priority L

This is similar to Stimulus Behavior Group VI, except that the opposite priority L is the state remaining, upon deassertion. This can only occur with the higher priority input not being active.

VIII - Demotion of priority: H-to-L

Here, a preemption state has been previously achieved, and the flip-flop edge-sensitive inputs are still locked out, but a switch in the priority that is asserted at the outputs occurs. This happens only if the higher-priority preemption input (again, chosen arbitrarily for the embodiment) is deasserted, a short time elapses, and the secondary-priority preemption input is still active.

Given the stimulus behavior group inputs, the switching results are definite and predictable, and vary only according to the BSM. The eight stimulus behavior groups cause RS and 2T dual-triggered flip-flop switching behaviors as shown in Tables III and IV, respectively.

TABLE III

COMPREHENSIVE FUNCTION TABLE
FOR DUAL EDGE-TRIGGERED RS Flip-Flop
(Presumed Programming: SET & RES active on +edge, PRESET & CLEAR assertive-low)

| Group | Case # | Input Stimulus to Flip-Flop | | | | Result after Tpd | | Function Performed |
|---|---|---|---|---|---|---|---|---|
| | | RES | SET | $\overline{PRESET}$ | $\overline{CLEAR}$ | Q | $\overline{Q}$ | |
| I | 1 | X | X | H | H | $Q_0$ | $\overline{Q_0}$ | (Do Nothing) |
| II | 2 | X | ↑ | H | H | H | L | If $Q_0$ was L, change to H on +edge of SET |
| | 3 | X | ↓ | H | H | $Q_0$ | $\overline{Q_0}$ | (Do Nothing) |
| | 4 | ↑ | X | H | H | L | H | If $Q_0$ was H, change to L on +edge of RES |
| | 5 | ↓ | X | H | H | $Q_0$ | $\overline{Q_0}$ | (Do Nothing) |
| III | 6 | ↓ | ↓ | H | H | $Q_0$ | $\overline{Q_0}$ | (Do Nothing) |
| | 7 | ↓ | ↑ | H | H | H | L | If $Q_0$ was L, change to H on +edge of SET |
| | 8 | ↑ | ↓ | H | H | L | H | If $Q_0$ was H, change to L on +edge of RES |
| | 9 | ↑ | ↑ | H | H | ? | ? | Cause Metastability* |
| IV | 10 | XE | XE | H | L | L | H | Force Priority L Condition |
| | 11 | XE | XE | L | XE | H | L | Force Priority H Condition |
| V | 12 | XE | XE | H | ↓ | L | H | Enter Priority L Condition |
| | 13 | XE | XE | ↓ | XE | H | L | Enter Priority H Condition |
| VI | 14 | XE− | ↑ | ↑ | ↑ | H | L | Leave Prior. H, remain H, (SET edge rejected) |
| | 15 | ↑ | XE− | ↑ | ↑ | H | L | Leave Prior. H, remain H, (RES edge rejected) |
| | 16 | ↑ | ↑ | ↑ | ↑ | H | L | Leave Prior. H, remain H, (Reject both SET & RES) |
| VII | 17 | XE− | ↑ | H | ↑ | L | H | Leave Prior. L, remain L, (SET edge rejected) |
| | 18 | ↑ | XE− | H | ↑ | L | H | Leave Prior. L, remain L, (RES edge rejected) |
| | 19 | ↑ | ↑ | H | ↑ | L | H | Leave Prior. L, remain L, (Reject both SET & RES) |
| VIII | 20 | XE | XE | ↑ | L | L | H | Switch Priority: H−to−L |

(Note: −edge programming of SET/RES results in opposite-state behavior; viz. ↑ becomes ↓, and XE− becomes XE+. XE covers either polarity of programming, and remains unchanged.)

* $\overline{PRESET}$ /$\overline{CLEAR}$ can be advantageously used to avoid this condition.

TABLE IV

COMPREHENSIVE FUNCTION TABLE
FOR DUAL EDGE-TRIGGERED 2T Flip-Flop
(Presumed Programming: T1 & T2 active on +edge, PRESET & CLEAR assertive-low)

| Group | Case # | Input Stimulus to Flip-Flop | | | | Result after Tpd | | Function Performed |
|---|---|---|---|---|---|---|---|---|
| | | T2 | T1 | $\overline{PRESET}$ | $\overline{CLEAR}$ | Q | $\overline{Q}$ | |
| I | 1 | X | X | H | H | $Q_0$ | $\overline{Q_0}$ | (Do Nothing) |

TABLE IV-continued

COMPREHENSIVE FUNCTION TABLE
FOR DUAL EDGE-TRIGGERED 2T Flip-Flop
(Presumed Programming: T1 & T2 active on +edge, PRESET & CLEAR assertive-low)

| Group ↓ | Case # | T2 | T1 | $\overline{PRESET}$ | $\overline{CLEAR}$ | Q | $\overline{Q}$ | Function Performed |
|---|---|---|---|---|---|---|---|---|
| II | 2 | X | ↑ | H | H | $\overline{Q_0}$ | $Q_0$ | Toggle on T1 +edge |
| | 3 | X | ↓ | H | H | $Q_0$ | $\overline{Q_0}$ | (Do Nothing) |
| | 4 | ↑ | X | H | H | $\overline{Q_0}$ | $Q_0$ | Toggle on T2 +edge |
| | 5 | ↓ | X | H | H | $Q_0$ | $\overline{Q_0}$ | (Do Nothing) |
| III | 6 | ↓ | ↓ | H | H | $Q_0$ | $\overline{Q_0}$ | (Do Nothing) |
| | 7 | ↓ | ↑ | H | H | $\overline{Q_0}$ | $Q_0$ | Toggle on T1 +edge |
| | 8 | ↑ | ↓ | H | H | $\overline{Q_0}$ | $Q_0$ | Toggle on T2 +edge |
| | 9 | ↑ | ↑ | H | H | $Q_0$ | $\overline{Q_0}$ | Dual-Toggle; No Change |
| IV | 10 | XE | XE | H | L | L | H | Force Priority L Condition |
| | 11 | XE | XE | L | XE | H | L | Force Priority H Condition |
| V | 12 | XE | XE | H | ↓ | L | H | Enter Priority L Condition |
| | 13 | XE | XE | ↓ | ↓ | H | L | Enter Priority H Condition |
| VI | 14 | XE− | ↑ | ↑ | ↑ | H | L | Leave Prior. H, remain H, (T1 clock is rejected) |
| | 15 | ↑ | XE− | ↑ | ↑ | H | L | Leave Prior. H, remain H, (T2 clock is rejected) |
| | 16 | ↑ | ↑ | ↑ | ↑ | H | L | Leave Prior. H, remain H, (Both T1 & T2 rejected) |
| VII | 17 | XE− | ↑ | H | ↑ | L | H | Leave Prior. L, remain L, (T1 clock is rejected) |
| | 18 | ↑ | XE− | H | ↑ | L | H | Leave Prior. L, remain L, (T2 clock is rejected) |
| | 19 | ↑ | ↑ | H | ↑ | L | H | Leave Prior. L, remain L, (Both T1 & T2 rejected) |
| VIII | 20 | XE | XE | ↑ | L | L | H | Switch Priority: H—to—L |

(Note: −edge programming of T1/T2 results in opposite-state behavior; viz. ↑ becomes ↓, and XE− becomes XE+. XE covers either polarity of programming, and remains unchanged.)

Referring to FIG. 6, the 2T flip-flop 70 output signal Q value toggles on each active edge of either of two asynchronous input signals T1 or T2, regardless of their relative timing. Precisely coincident active edges of T1 and T2 produce an infinitesimal or undetectable-duration output signal Q. The 2T flip-flop 70 comprises two input stages INS1T and INS2T which may each be equivalent to independent flip-flops with additional clocking lock-out logic via the preemption inputs $\overline{PRESET}$ and $\overline{CLEAR}$. The normal twin edge-sensitive switching behavior of the 2T flip-flop 70 created according to the teaching of this invention will be explained with the help of FIG. 7, a detailed gate-level example embodiment. In this initial description of the embodiment, the discussion of the $\overline{PRESET}$ and $\overline{CLEAR}$ preemption switching behavior for the 2T flip-flop 70 is deferred until after the edge-sensitive inputs of the alternate embodiment, RS flip-flop 100, are also described; the preemption features will be subsequently discussed, as these are common to all embodiments, regardless of the BSM employed. For the edge-sensitive discussions, the $\overline{PRESET}$ and $\overline{CLEAR}$ lines are presumed to be assertive-LOW, and are left in the disactive or HIGH state, having no affect upon the edge-sensitive inputs or the logic within FIG. 7 (2T) or FIG. 13 (RS).

Figure 7:
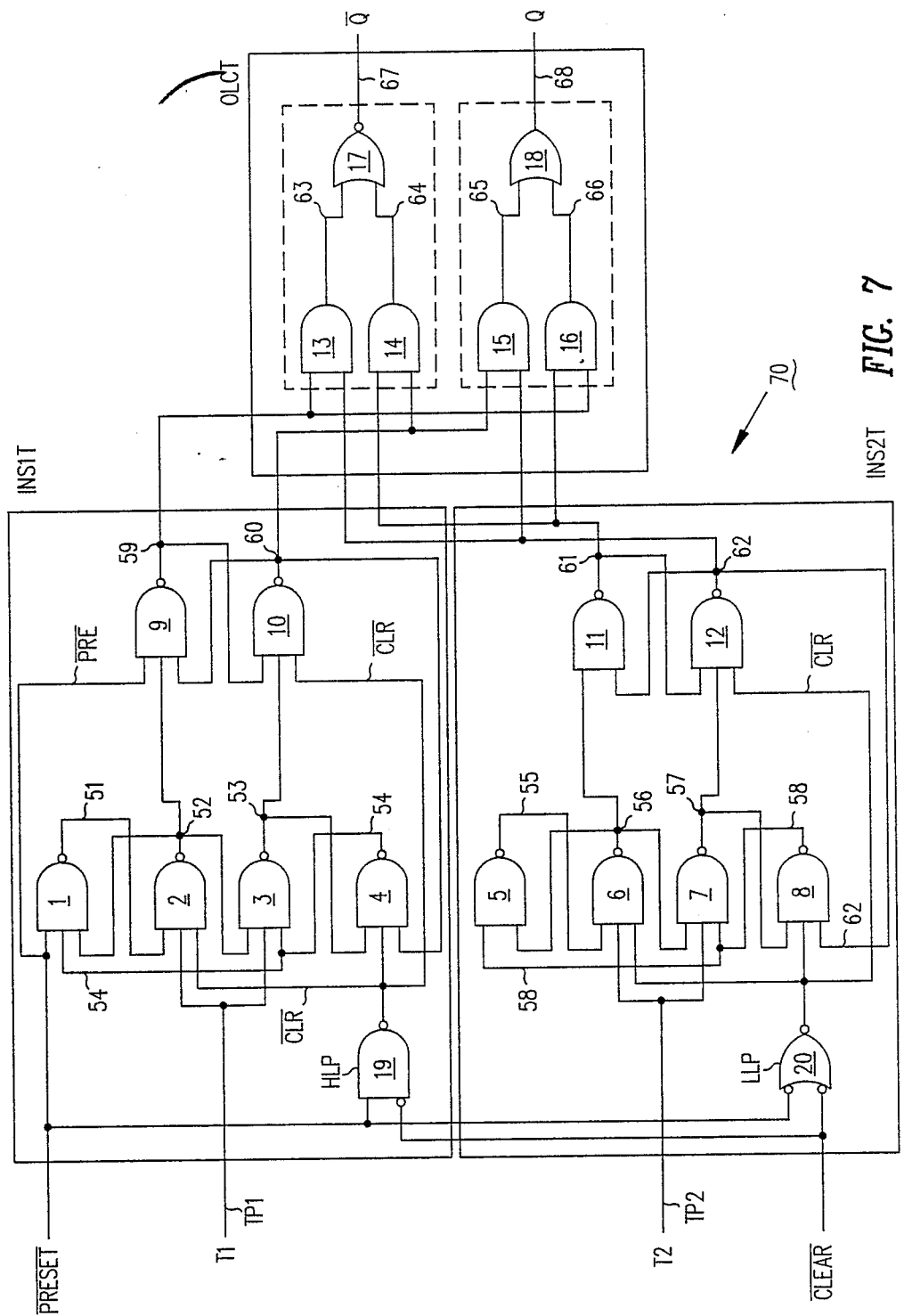
FIG. 7 shows the FIG. 6 circuit in gate-level detail.

In referring to FIG. 7, in upper input stage INS1T, when a not-yet-asserted LOW control signal T1 is received, NAND gates 2 and 3 produce HIGH signals on lines 52 and 53, permitting NAND gates 9 and 10, cross-coupled as a flip-flop to be stable in either of two states. Under the conditions of edge-triggered stimulation only, the lines $\overline{PRE}$ and $\overline{CLR}$ internal to INST1 are at disactive HIGH levels, not affecting the outcome of stimuli by edge-sensitive input T1.

The upper input stage INS1T has two internal states, SET-AT-HIGH and SET-AT-LOW. These internal states are the logic values of line 59 within INS1T.

In the SET-AT HIGH state, line 60 is LOW and line 52 is HIGH. NAND gate 4 produces a HIGH signal on line 54, by virtue of the LOW on line 60, for input to NAND gate 3 and NAND gate 1. Stage INS1T starts to switch to the SET-AT-LOW state when input signal T1 rises to HIGH, making all input lines HIGH to NAND gate 3, which switches line 53 LOW, making a second input signal LOW to NAND gate 4. Switching line 53 LOW also causes NAND gate 10 to switchline 60 HIGH, but while line 53 is LOW, NAND gate 4 continues holding line 54 HIGH. When input signal T1 falls to LOW, NAND gate 3 raises line 53, making all input lines HIGH to NAND gate 4, which switches line 54 again, while in the SET-AT-LOW state. Switching line 54 LOW also causes NAND gate 1 to switch line 51 HIGH, enabling NAND gate 2 to switch line 52 LOW upon the next rising T1 input signal.

The alternate state that INS1T can be at is SET-AT-LOW. This is indicated by a HIGH at line 60. NAND gate 4 provides a LOW signal on line 54, causing NAND gates 1 and 3 to provide HIGH signals on lines 51 and 53 respectively. Input signal T1 rising to HIGH makes all inputs HIGH to gate 2, which switches line 52 LOW, consequently switching line 59 HIGH, which makes all inputs to gate 10 HIGH switching line 60 LOW. When line 60 is LOW, gate 4 holds line 54

HIGH. When T1 later switches LOW, gate 2 raises line 52 HIGH. Line 52 and 54 signals both HIGH cause gate 1 to hold line 51 LOW, disabling gate 2 from responding to the next rising T1 signal while in the SET-AT-HIGH, and permitting instead gate 3 instead to respond.

It can be readily seen that at any time, a rising input signal T1 toggles the upper input stage INS1T intermediate output line 59 signal Q and intermediate output line 60 $\overline{Q}$ between SET-AT-HIGH and SET-AT-LOW states upon every rising T1 signal. In the gate-level example embodiment of FIG. 7, T1 must be held HIGH for at least three gate delays. The INS1T stage also requires that input T1 signal remain LOW for at least 3 gate delays prior to reactivation of the input stage. The minimum acceptable period that T1 can be therefore reliably be used is a total of 6 gate delay times, with an even split between HIGH and LOW times, each not less than 3 gate delays.

In identical fashion to the operation of upper input stage INS1T, the lower input stage INST2 functions so as to toggle between SET-AT-LOW and SET-AT-HIGH internal states upon intermediate output line 61 signal Q, and intermediate output line 62 signal $\overline{Q}$. To achieve the preemption functionality of Table IV, the lower input stage INS2T does not need an internal PRE node; instead, only a $\overline{CLR}$ node is required; this is also illustrated in the earlier FIG. 6. Stage INST2 also has a completely symmetric T2 input signal recycling trigger period of six gate delays minimum, at conditions of 50% duty cycle, as exemplified in the gate-level example embodiment of FIG. 7.

The complete 2T flip-flop 70 is formed by connection of upper and lower input stages INS1T and INS2T respectively to output stage OLCT. Only these input stages have bistables, resulting in flip-flop memory action upon separate input signals T1 and T2. Output stage OLCT functions as a memory-less logic network, essentially performing the function of a pair of XOR gates, one for the final $\overline{Q}$ (line 67, FIG. 7) of flip-flop 70, and one for the final output $\overline{Q}$ (line 68, FIG. 7). The XOR gate for line 67 is formed by a composite of gates 13, 14 and 17, with interconnecting lines 63 and 64. The XOR function for line 67 is achieved by use of the twin complementary output of stage INS1T lines 59/60 and stage INS2T lines 61/62, respectively. Similarly, to complement final output line 68 of the 2T flip-flop 70 uses the composite of gates 15, 16 and 18, with interconnecting lines 65 and 66 to create the XOR gate. The same technique of usage of twin complementary output lines between stages INS1T (lines 59 and 60) and INS2T (lines 61 and 62) is used here also, only the input signal pathing from stage INS1T is "bit-reversed" with respect to the Q output XOR gate, in order to create a complement output signal $\overline{Q}$.

Whenever either pair of intermediate output signals of either input stage INS1T or INS2T exchanges states between SET-AT-HIGH, or SET-AT-LOW, or vice versa, output stage OLCT likewise exchanges the values on the 2T flip-flop output lines 67 and 68. No combination of intermediate signals from INS1T or INS2T can possibly conflict for the XOR function, which results in metastable-free logic operation of the output state OLCT, because it is a memory-less network. Further, since independent edge-sensitive action at T1 and T2 inputs is provided by the independent stages INS1T and INS2T, the output lines 67 and 68 of the 2T flip-flop can never inhibit input stages INS1T or INS2T. the only requirement for triggering operation of either stage INS1T or stage INS2T (individually) is a sufficiently wide pulse of approximately a minimum of 3 gate delays at stage HIGH or LOW, in the example embodiment of FIG. 7. Accordingly, no combination whatsoever of input signal edges at input paths T1 and T2 can impinge on the 2T flip-flop 70 to cause metastability, under these conditions. In addition, the twin-independent architecture of the invention beneficially assures that there is simply not a set-up or hold time requirement at either input because the twin pathing of the edge-sensitive signals are totally unrelated to each other, and have no internal or external signal relationship requiring secondary synchronization.

Referring to FIG. 13, the double edge-triggered RS flip-flop 100 in either the HIGH or the LOW state, at line 160 output Q, disables the input stage INS1RS OR INS2RS which asserted that state from responding to another input signal reasserting the same state, and enables the alternate input stage INS2RS or INS1RS to respond to the next active input signal (asserting the alternate state).

For example, when the RS flip-flop 100 is LOW, output signal Q line 160 goes LOW and causes NAND gate 103 to raise the value on line 153 to NAND gate 104. When the RES signal falls inactive, line 154 goes HIGH. A subsequent redundant RES signal rising causes NAND gate 104 to lower line 154 to NAND gate 106, blocking the redundant rising RES signal from causing NAND gate 106 to lower intermediate output line 156.

On the other hand, while in the LOW state, output signal $\overline{Q}$ line 159 being HIGH together with line 151, likewise left HIGH by the previous SET operation, causes NAND gate 102 to lower line 152, which causes NAND gate 101 to raise line 151, allowing a subsequent rising SET signal to cause NAND gate 105 to produce a LOW signal on line 155.

A LOW signal from gate 105 causes NAND gate 107 to produce a HIGH signal output on line 157 which branches through, and is delayed by, different gates to successively lock in the new HIGH state, change the output line 159 and 160 values, disable reception of redundant SET signals reasserting the new state, and enable reception of a RES signal asserting the alternate state. From line 157, the HIGH signal propagates in parallel through inverter 109 to switch the signal value on flip-flop output line 159, and through gate 108 to provide a LOW signal on line 158 to lock gate 107 output line 157 LOW, after first a gate delay. From line 158 the LOW signal propagates through inverter 110 to switch output line 160 HIGH, after a second gate delay. From line 159, the LOW signal propagates through gates 102 and 101 to lower the signal on line 151 and disable gate 105 (from responding to possible redundant SET signals) after second and third gate delays. From line 160, the HIGH signal propagates through gates 103 and 104 to enable gate 106 (to respond to a new RES signal) after third and fourth gate delays.

The RS flip-flop uses, from the time a new active phase SET or RES signal is received, four gate delays to switch both flip-flop output lines, and two more gate delays until the alternate state input state is enabled to respond to the alternate control input signal. The RS flip-flop can switch at a $t_{diff}(min)$ of six gate delays, or with a period of twelve gate delays. The RS is designed explicitly for time separated signals; the $t_{diff}(min)$ represents the minimum time for a 'turn-over' in output state ONLY immediately after a given active-phase edge-event. This turn-over time is quite rapid, and is advantageously applied in typical applications. However, once the $t_{dif}$(min) time has expired, the RS does allow the inputs to be simultaneously active, only one is locked-out, due to the feedback-driven input redirection. The locked-out input may actually "violate" normal pulse-width requirements, and may be switching right up to the edge-transition of the alternate input. Once the active edge-transition occurs on the alternate input, a new $t_{dif}$(min) period must be satisfied. Once $t_{dif}$(min) expires, the newly locked-out alternate input may likewise behave "erratically" without disturbing the RS flip-flop 100.

The switching functionality of the $\overline{PRESET}$ and $\overline{CLEAR}$ inputs respectively of the 2T flip-flop 70 and the RS flip-flop 100 is conceptualized from the generic architecture of the invention 80 shown in FIG. 3. The Level-Assertive High Priority Circuit and the Level-Assertive Low Priority circuit of 80 both preempt or override the edge-sensitive switching blocks INS1 and INS2 independent of and without regard to the state of the internal inputs TP1 and TP2, and without regard to the flip-flop BSM.

In addition to the preemption of the edge-sensitive inputs, both Priority Circuits interact with each other to allow predeterminable "wins" or specific output states from simultaneous assertion of $\overline{PRESET}$ and $\overline{CLEAR}$ in 80. The Priority Circuits are arranged for predeterminable outcomes from every possible combination of assertions upon the preemption inputs. These various preemption switching behaviors are uniform for every embodiment, regardless of the particular BSM, which affects only the edge-sensitive triggering inputs. For each embodiment, the preemption switching behavior is detailed in Table III and Table IV (RS and 2T BSMs respectively), under Stimulus Behavior Groups IV, V, VI, VII, and VIII.

The switching behavior of the total flip-flop 80, (and to be explained shortly, example embodiments of flip-flops 70 and 100) is hierarchical in that one preemption input (arbitrarily chosen to be the $\overline{PRESET}$ in the embodiments) overrides the subordinated input (the remaining level-sensitive input $\overline{CLEAR}$), in producing a valid logic output; next, either or both preemption inputs override edge-sensitive triggering; last in the hierarchy, the edge-sensitive inputs are operative.

Regarding FIG. 6, FIG. 7 and FIG. 13, the detailed descriptions are given with the presumption that the polarity sensitizing gates are actually present in the embodiment to choose active-edge and active-level polarities for the twin edge-inputs, and the pair of preemption inputs, respectively. These polarity gates, as in the XOR gates controlled by SW2, SW3, SW4, and SW5 of FIG. 3, are omitted from FIG. 6, FIG. 7, and FIG. 8 for the purpose of clarity. The default programming of polarity is for illustration purposes to be assertive-LOW for $\overline{PRESET/CLEAR}$, and positive edge-triggered for the twin edge-sensitive inputs RES/SET (for the RS flip-flop), or T1/T2 (for the 2T flip-flop).

For 2T flip-flop 70, referring first to FIG. 6, a conceptual drawing of an embodiment of 2T flip-flop, the $\overline{PRESET}$ and $\overline{CLEAR}$ inputs feed bistables INS1T and INS2T, in direct level-sensitive internal pathways, $\overline{PRE/CLR}$ for INS1T, and CLR for INS2T. In addition, these connections work in conjunction with a pair of gates HLP and LLP, to achieve a priority between the $\overline{PRESET}$ and $\overline{CLEAR}$ inputs. Gate HLP corresponds to the High-Level Priority Circuit of FIG. 3, of the flip-flop 80. Similarly, gate LLP corresponds to the Low-Level Priority Circuit of 80.

The gates HLP and LLP of FIG. 6 give $\overline{PRESET}$ higher priority over $\overline{CLEAR}$ (an arbitrary choice). These gates and the direct level-sensitive connections to INS1T and INS2T work to achieve the functionality of Table IV, in terms of $\overline{PRESET}$ unequivocally forcing output Q to a HIGH state, and similarly, in the absence of an asserted $\overline{PRESET}$, allowing $\overline{CLEAR}$ to unequivocably force a LOW at signal Q.

The preemption switching behavior is achieved by logic means as well as the fact that the $\overline{PRE/CLR}$ and $\overline{CLR}$ paths of INS1 and INS2, respectively, pass through these bistables with fewer gate delays than the edge-sensitive inputs. This situation means that the preemption inputs unambiguously stimulate bistables INS1 and INS2 faster than a simultaneously occurring edge-sensitive input, therewith achieving the preemption functionally described in Table IV.

In the 2T flip-flop 70, as shown in FIG. 7, the prioritizing gates HLP (gate 19) and LLP (gate 20), are shown functioning just as described for FIG. 6. As in FIG. 6, the $\overline{PRE/CLR}$ nodes within INS1T are controlled by gate HLP, and the $\overline{CLR}$ node within INS2T is controlled by gate LLP. Gate HLP is a NAND gate with one inverting input, which is shown with a bubble at the input. Gate LLP is a NOR gate that has two inverting inputs, also shown with bubbles.

$\overline{PRESET}$ and $\overline{CLEAR}$ affect the INST1 and INST2 blocks of 70, as shown in FIG. 7, using gates HLP and LLP according to the relations expressed in Table V. If gate HLP outputs a LOW, the $\overline{CLR}$ path of INS1T is brought to LOW, which results in a SET-AT-LOW state of the INST1T stage, wherein intermediate output line 59 signal Q is LOW. Similarly, if gate LLP outputs a LOW, the $\overline{CLR}$ pathway of INS2T drops to LOW, resulting in a SET-AT-LOW state of the INS2T stage, which is indicated by a LOW at intermediate output line 61 signal Q.

TABLE V

Preemption Conditions and Gates HLP and LLP
(2T Example Embodiment, FIG. 6, FIG. 7)

| PRESET | CLEAR | Function | HLP | LLP |
|---|---|---|---|---|
| LOW | LOW | Priority HIGH | HIGH | LOW |
| LOW | HIGH | Priority HIGH | HIGH | LOW |
| HIGH | LOW | Priority LOW | LOW | LOW |
| HIGH | HIGH | no change | HIGH | HIGH |

To achieve the Priority HIGH condition of Tables IV and V, referring to FIG. 7, the input $\overline{PRESET}$ passes to gate 1 and 9, as well as gate 19, also shown as Gate HLP. $\overline{PRESET}$ unequivocally forces a HIGH at final output 68 by forcing upper stage INS1T to the SET-AT-HIGH state, at line 59, and by forcing lower stage INS2T to the SET-AT-LOW state. By the relation of the composite XOR gate resulting from gates 15, 16 and 18, the final output line 68 signal Q will be set to HIGH. Within INS1T, Gate 19 (gate HLP) disallows a LOW caused by $\overline{CLEAR}$, by forcing line $\overline{CLR}$ to HIGH, if $\overline{PRESET}$ is present, thus disabling the $\overline{CLEAR}$ from operation of stage INS1T.

The pathway for $\overline{PRESET}$ is shorter than for $\overline{CLEAR}$, allowing time-domain preemption of simultaneously occurring inputs in favor of $\overline{PRESET}$. This happens because only one gate delay (at gate 9) has to expire before the output stage OLCT can start switching to its HIGH state. Simultaneously, because $\overline{\text{PRE}}$ $\overline{\text{SET}}$ directly ties to gates 1 and 19 (gate HLP), the INS1T stage internally switches faster toward the SET-AT-HIGH state than possibly conflictual action to switch the stage toward SET-AT-LOW, as caused by a coincidental $\overline{\text{CLEAR}}$ assertion. For $\overline{\text{CLEAR}}$ to gain control of the INS1T stage, gate HLP must be LOW, which can only happen in the absence of $\overline{\text{PRESET}}$. As indicated in the example embodiment of FIG. 7, by the inversion bubble at gate HLP, the $\overline{\text{CLEAR}}$ pathway may be designed to have "farther to go" than the $\overline{\text{PRE}}$ $\overline{\text{SET}}$, thus guaranteeing the desired preemption priority. The priority relation desired can be alternatively realized through slightly different connection means in the FIG. 7 example. Lastly, due to the interaction of gates HLP and LLP upon stages INS1T and INS2T respectively, as described in Table V, the $\overline{\text{PRESET}}$ signal has "logical" priority over $\overline{\text{CLEAR}}$. Therefore, $\overline{\text{PRESET}}$ has the highest possible precedence in the switching hierarchy, followed by $\overline{\text{CLEAR}}$, then finally, the edge-sensitive inputs.

To achieve the Priority LOW condition of Tables IV and V, referring to FIG. 7, $\overline{\text{CLEAR}}$ must be asserted LOW, $\overline{\text{PRESET}}$ must not be asserted, and is therefore HIGH. The $\overline{\text{CLEAR}}$ input passes only to gates HLP and LLP within the 2T flip-flop 70 of FIG. 7, and therefore has only indirect control over stages INS1T and INS2T. Priority LOW results from having stage INS1T at the SET-AT-LOW state, while also having stage INS2T at the SET-AT-LOW state. Hence, as according to Table V, a $\overline{\text{CLEAR}}$ assertion alone causes a LOW at both gates HLP and LLP, which immediately causes the INS1T and INS2T stages to latch towards the SET-AT-LOW states, respectively. This action occurs more directly than edge-sensitive activity at inputs T1/T2, which operates only gates 2/3 and 6/7, which is even more indirect in causing changes at the INS1T and INS2T stages respectively.

For the RS flip-flop 100, referring to FIG. 13, the $\overline{\text{PRESET}}$ and $\overline{\text{CLEAR}}$ inputs feed directly to bistables INS1RS and INS2RS, as well as directly to the output stage OLCRS. These pathways are level-sensitive internal pathways, $\overline{\text{PRESET}}$ connecting to gates 103, 107, and 111, and $\overline{\text{CLEAR}}$ connecting only to gate HLP/LLP (gate 111), which is a NAND gate having one inverting input, as indicated by the inversion bubble where $\overline{\text{CLEAR}}$ comes in to this gate. Gate 111 feeds subsequently to NAND gates 102 and 108. Gate HLP/LLP (gate 111), functions to achieve a priority between the $\overline{\text{PRESET}}$ and $\overline{\text{CLEAR}}$ inputs. For the RS flip-flop 100, only a single gate HLP/LLP is required to achieve the preemption switching functionality according to Table III. This single gate corresponds to the HIGH Level Priority Circuit of FIG. 3, of the flip-flop 80, as well as the Low-Level Priority Circuit of 80.

As in the 2T flip-flop 70, the RS flip-flop 100 is arbitrarily set up to give $\overline{\text{PRESET}}$ higher precedence than $\overline{\text{CLEAR}}$, and to have either or both signals disallow edge-sensitive inputs SET and RES. The level-sensitive preemption behavior is achieved by logic means as well as the fact that $\overline{\text{PRESET}}$ and $\overline{\text{CLEAR}}$ pass through the key operative control element of the RS flip-flop 100, which is the stage OLCRS, just as shown, according to the invention, as described for FIG. 3. An internal $\overline{\text{PRE}}$ line is within the lower stage INS2RS, at NAND gate 103, of the example embodiment FIG. 13; similarly, an internal $\overline{\text{CLR}}$ line is within the upper stage INS1RS, at NAND gate 102. The $\overline{\text{PRE}}$ line also connects to NAND gate 107, and has a faster time-domain response to $\overline{\text{PRE}}$ $\overline{\text{SET}}$ asserted LOW, than does the $\overline{\text{CLR}}$ line, connecting to NAND gate 108, but which comes from the output of gate HLP/LLP (gate 111), at the input of which $\overline{\text{CLEAR}}$ first starts. In a Priority HIGH condition, $\overline{\text{PRE}}$ forces the line $\overline{\text{CLR}}$ HIGH, via gate HLP/LLP, which keeps the $\overline{\text{CLEAR}}$ input from affecting the gates 102 and 108. Table VI illustrates for clarity the output states of gate HLP/LLP.

TABLE VI

Preemption Conditions and Gate HLP/LLP
(RS Example Embodiment, FIG. 13)

| $\overline{\text{PRESET}}$ | $\overline{\text{CLEAR}}$ | Function | HLP/LLP output |
|---|---|---|---|
| LOW | LOW | Priority HIGH | HIGH |
| LOW | HIGH | Priority HIGH | HIGH |
| HIGH | LOW | Priority LOW | LOW |
| HIGH | HIGH | no change | HIGH |

A Priority HIGH condition, as per Tables III and VI, in the RS flip-flop 100 occurs from a LOW assertion of $\overline{\text{PRESET}}$ which also makes $\overline{\text{PRE}}$ LOW, affecting a change to HIGH upon lines 153 and 157, resulting in latching of the bistable in OLCRS formed by NAND gates 107 and 108. The final output Q at line 160 is then subsequently forced to HIGH. Simultaneously, line $\overline{\text{PRE}}$ at gate 103 prevents the edge-sensitive input RES from causing a conflictual change in stage INS2RS by forcing line 153 to HIGH. $\overline{\text{PRE}}$ also causes gate 111 to be forced a HIGH on line $\overline{\text{CLR}}$. A SET positive edge-transition occurring anytime with $\overline{\text{PRESET}}$ asserted has no effect on the RS flip-flop 100, due to the redundant non-conflicting states sought.

A Priority LOW condition, as per Tables III and VI, in the RS flip-flop 100 occurs from a LOW assertion of $\overline{\text{CLEAR}}$ which also makes $\overline{\text{CLR}}$ LOW, only if $\overline{\text{PRE}}$ is HIGH, thereby affecting a change to HIGH upon lines 152 and 158. This results in latching of the bistable in OLCRS formed by NAND gates 107 and 108. The final output Q at line 160 is then subsequently forced to LOW. Simultaneously, line $\overline{\text{CLR}}$ at gate 102 prevents the edge-sensitive input SET from conflictually causing a change in stage INS1RS by forcing line 152 to HIGH. A RES positive edge-transition occurring anytime with $\overline{\text{CLEAR}}$ asserted has no effect on the RS flip-flop 100, due to the redundant non-conflicting states sought.

Any priority condition HIGH or LOW leaves the 2T flip-flop 70 or the RS flip-flop 100 in the relevant last state until further stimulus occurs, causing a change in priority, or in the absence of preemption, any edge-sensitive input(s) causes a change. If $\overline{\text{PRESET}}$ and $\overline{\text{CLEAR}}$ are used together or overlapingly, the edge-sensitive inputs may be totally reliably "locked-out". If any one preemption input is used against any or both edge-sensitive inputs, various kinds of "strong-weak" flip-flops can be created from the basic flip-flops 70 and 100. Every flip-flop constructed according to the invention operates with this preemption-with-memory functionally, regardless of the BSM.

A preferred embodiment has been illustrated, of which modifications and adaptations within the scope of the invention will occur to those skilled in the art. The invention is limited only by the scope of the following claims.

I claim:

1. A flip-flop circuit comprising:

a first flip-flop having four input terminals for receiving input signals thereat;
a second flip-flop having at least three input terminals for receiving input signals thereat;
means for providing a first input signal to a first input terminal of the first flip-flop;
means for providing a second input signal to a first input terminal of the second flip-flop;
a priority circuit for determining priority between input signals and for receiving at first and second input terminals thereof, respectively a third input signal and a fourth input signal, and also having a first and a second output terminal for issuing output signals;
wherein the first output terminal of the priority circuit is connected to a third input terminal of the second flip-flop and wherein the second output terminal of the priority circuit is connected to a third input terminal of the first flip-flop;
wherein the third input signal is provided to a fourth input terminal of the first flip-flop;
an output logic circuit having two input terminals for receiving signals thereat and one output terminal for issuing an output signal, wherein the output logic circuit logically combines the signals received at its input terminals;
wherein a first output terminal of the first flip-flop is connected to a first input terminal of the output logic circuit, and wherein a first output terminal of the second flip-flop is connected to a second input terminal of the output logic circuit; and
wherein a second output terminal of the first flip-flop is connected to a second input terminal of the first flip-flop and wherein a second output terminal of the second flip-flop is connected to a second input terminal of the second flip-flop.

2. The device of claim 1, wherein the priority circuit includes a NAND gate and a NOR gate, and wherein the NAND gate receives the third and fourth input signals at its input terminals and has an output terminal connected to the third input terminal of the first flip-flop, and wherein the NOR gate receives the third and fourth input signals at its input terminals and has its output terminal connected to the third input terminal of the second flip-flop.

3. The device of claim 1, wherein the output logic circuit includes a XOR gate having two input terminals respectively connected to the first output terminal of the first flip-flop and to the first output terminal of the second flip-flop and wherein the output terminal of the XOR gate is the output terminal of the circuit.

4. The device of claim 1, wherein both the first flip-flop and the second flip-flop are D type flip-flops.

5. A bistable dual triggered 2T flip-flop circuit comprising:
a logic circuit having first, second, third and fourth input terminals to receive first, second third and fourth input signals thereat and having first and second output terminals to issue first and second output signals thereat;
arbitration means for receiving the third input signal and the fourth input signal and, when these two signals are driven substantially simultaneously to their active states, for arbitrating between the third and fourth input signals and determining which of these two signals shall preempt the other of these two signals in determining the first output signal and the second output signal thereby providing arbitration outputs;
first and second sequential logic input stages, operating substantially in parallel, with each stage responsive only to a different one of the first input signal and the second input signal, where the first logic input stage receives the first input signal, the third input signal and one of the arbitration outputs and produces a first intermediate signal that cannot cause a metastable state in the circuit, and where the second logic input stage receives the second input signal and another one of the arbitration outputs and produces a second intermediate signal that cannot cause a metastable state in the circuit;
a logic output stage that receives the first intermediate signal and the second intermediate signal, and produces an output signal as a logical combination thereof;
wherein an inversion of the first intermediate signal is provided as an input signal to the first logic input stage, and an inversion of the second intermediate signal is provided as an input signal to the second logic input stage.

6. A circuit comprising:
a first logic circuit having three input terminals for receiving input signals thereat and having at least one output terminal and wherein a signal is provided at the output terminal that cannot cause a metastable state in the circuit;
a second logic circuit having three input terminals for receiving input signals thereat and having one output terminal and wherein a signal is provided at the output terminal that cannot cause a metastable state in the circuit;
means for providing a first input signal to a first input terminal of the first logic circuit;
means for providing a second input signal to a first input terminal of the second logic circuit;
a priority circuit for determining priority between input signals and having two input terminals for receiving input signals thereat and having one output terminal, and wherein a third input signal is provided to a first input terminal of the priority circuit;
an output logic circuit having four input terminals for receiving input signals thereat and having two output terminals for providing output signals, wherein the output logic circuit produces the output signals according to the phases of each of the signals input thereto without causing any metastability in the circuit;
means for providing a fourth input signal to a second input terminal of the priority circuit, and to a second input terminal of the second logic circuit, and to a fourth input terminal of the output logic circuit;
wherein the output terminal of the first logic circuit is connected to a second input terminal of the output logic circuit, and wherein the output terminal of the second logic circuit is connected to a third input terminal of the output logic circuit; and
wherein a first output terminal of the output logic circuit is connected to a third input terminal of the first logic circuit and wherein a second input terminal of the output circuit is connected to a third input terminal of the second logic circuit.

7. The device of claim 6, wherein the priority circuits include a NAND gate having two input terminals connected respectively for receiving the third input signal and the fourth input signal, and having its output terminal connected to the second input terminal of the first logic circuit and to the first input terminal of the output logic circuit.

8. The device of claim 6, wherein a polarity of the signal at the first output terminal of the output logic circuit is inverse to a polarity of the signal at the second output terminal of the output logic circuit.

9. A bistable dual triggered RS flip-flop circuit comprising:
  a logic circuit having first, second, third and fourth input terminals to receive first, second, third and fourth input signals thereat and having first and second output terminals to issue first and second output signals thereat;
  arbitration means for receiving the third input signal and the fourth input signal and, when these two signals are driven substantially simultaneously to their active states, for arbitrating between the third and fourth input signals and determining which of these two signals shall preempt the other of these two signals in determining the first output signal and the second output signal;
  first and second sequential logic input stages, operating substantially in parallel, with each stage responsive only to a different one of the first input signal and the second input signal, where the first logic input stage receives the first input signal, and produces a first intermediate signal that cannot cause a metastable state in the circuit; and where the second logic input stage receives the second input signal and the third input signal and produces a second intermediate signal that cannot cause a metastable state in the circuit;
  a logic output stage that receives the third input signal, the product of the third input signal and the fourth input signal, the first intermediate signal and the second intermediate signal, and produces an output signal according to the phases of the first input signal, the second input signal, the third input signal and the fourth input signal without causing any metastability in the circuit;
  first feedback means for providing the output signal as an input signal to the first logic input stage; and
  second feedback means for providing an inversion of the output signal as an input to the second input stage.

10. A bistable flip-flop circuit comprising:
  circuit means having first, second, third and fourth input terminals adapted to receive first, second, third and fourth input signals, respectively, and having first and second output terminals to issue output signals thereat, where receipt of an active fourth input signal preempts the remainder of the circuit except for the third input signal, and determines the first and second output signals, and receipt of an active third input signal preempts the fourth input signal and the remainder of the circuit and determine the first and second output signals;
  first, second, third, fourth, fifth, sixth and seven NAND gates, each having an output terminal for issue of a NAND gate output signal thereat, with the first, second third, fourth, fifth and sixth NAND gates each having three input terminals, and with the seventh NAND gate having two input terminals, with the first, fifth and seventh NAND gates each receiving the third input signal, with the second and third NAND gates each receiving the first input signal, with the first NAND gate receiving the second NAND gate output signal and receiving the fourth NAND gate output signal, with the second NAND gate receiving the first NAND gate output signal and receiving the seventh NAND gate output signal, with the third NAND gate receiving the second NAND gate output signal and receiving the fourth NAND gate output signal, with the fourth NAND gate receiving the third NAND gate output signal and receiving the sixth NAND gate output signal and receiving the seventh NAND output signal, with the fifth NAND gate receiving the second NAND gate output signal and receiving the sixth NAND gate output signal, with the sixth NAND gate receiving the fifth NAND gate output signal and receiving the third NAND gate output signal and receiving the seventh NAND gate output signal, and with the seventh NAND gate receiving the binary complement of the fourth input signal;
  a first NOR gate having two input terminals and an output terminal to issue an output signal thereof, with the NOR gate receiving the third and fourth input signals at its input terminals;
  eighth, ninth, tenth, eleventh, twelfth and thirteenth NAND gate, each having an output terminal to issue an output terminal to issue an output signal thereat, with the ninth, tenth, eleventh, thirteenth NAND gates each having three input terminals and with the eighth and twelfth NAND gates each having two input terminals, with the ninth, eleventh and thirteenth NAND gates each receiving the output signal from the first NOR gate, with the eighth NAND gate receiving the ninth NAND gate output signal and receiving the eleventh NAND gate output signal, with the ninth and tenth NAND gates each receiving the second input signal, with the ninth NAND gate receiving the eighth NAND gate output signal, with the tenth NAND gate receiving the ninth NAND gate output signal and receiving the eleventh NAND output signal, with the eleventh NAND gate receiving the thirteenth NAND gate output signal, with the twelfth NAND gate receiving the ninth NAND gate output signal and receiving the thirteenth NAND gate output signal, and with the thirteenth NAND gate receiving the twelfth NAND gate output signal and receiving the tenth NAND gate output signal;
  first, second, third and fourth AND gates, each having two input terminals and each having an output terminal to issue an output signal thereat, with the first AND gate receiving the fifth NAND gate output signal and receiving the thirteenth NAND gate output signal, with the second AND gate receiving the sixth NAND gate output signal and receiving the twelfth NAND gate output signal, with the third NAND gate receiving the sixth NAND gate output signal and receiving the thirteenth AND gate output signal, and with the fourth AND gate receiving the fifth NAND gate output signal and receiving the twelfth NAND gate output signal; and
  a first NOR gate and an OR gate, each gate having two input terminals and an output terminal to issue output signals thereat, with the first NOR gate receiving the second AND gate output signal and receiving the third AND gate output signal, with the OR gate receiving the fourth AND gate output signal and receiving the fifth AND gate output signal, where the first NOR gate and the OR gate issue first and second output signals, respectively, that are binary complements of one another, where receipt of an active signal at the third input terminal determines the first and second output signals of the circuit irrespective of any signals simultaneously or subsequently received at the first input terminal, the second input terminal or the fourth input terminal, and where receipt of an active signal at the fourth input terminal determines the first and second output signals of the circuit irrespective of any signals simultaneously or subsequently received at the first input terminal or the second input terminal.

11. A bistable flip-flop circuit comprising:

circuit means having first, second, third and fourth input terminals adapted to receive first, second, third and fourth input signals, respectively, and having first and second output terminals to issue output signals thereat, where receipt of an active fourth input signal preempts the remainder of the circuit, except for the third input signal, and determines the first and second output signals, and receipt of an active third input signal preempts the fourth input signal and the remainder of the circuit and determines the first and second output signals;

first, second, third, fourth, fifth, sixth, seventh, and eighth and ninth NAND gates, each having an output terminal for issue of a NAND gate output signal thereat, with the first, fourth, fifth, sixth and ninth NAND gates each having two input terminals and with the second, third, seventh and eighth NAND gates each having three input terminals;

first and second signal inverters, each having an input terminal to receive and input signal and having an output terminal to issue an output signal thereat;

with the first and fifth NAND gates each receiving the first input signal, with the fourth and sixth NAND gates each receiving the second input signal, with the third, seventh and ninth NAND gates each receiving the third input signal, and with the ninth NAND gate receiving the fourth input signal;

with the first NAND gate receiving the second NAND gate output signal, with the second NAND gate receiving the first NAND gate output signal and receiving the ninth NAND gate output signal and receiving the first inverter output signal;

with the third NAND gate receiving the fourth NAND gate output signal and receiving the second inverter output signal, with the fourth NAND gate receiving the third NAND gate output signal;

with the fifth NAND gate receiving the first NAND gate output signal, with the sixth NAND gate receiving the fourth NAND gate output signal;

with the seventh NAND gate receiving the fifth NAND gate output signal and receiving the eighth NAND gate output signal, with the eighth NAND gate receiving the sixth NAND gate output signal and receiving the seventh NAND gate output signal and receiving the ninth NAND gate output signal; and with the first inverter receiving the seventh NAND gate output signal, and with the second inverter receiving the eighth NAND gate output signal, where the output signals of the first and second inverters serve as the first and second output signals of the circuit.

* * * * *

UNITED STATES PATENT AND TRADEMARK OFFICE
CERTIFICATE OF CORRECTION

PATENT NO. : 4,980,577
DATED : December 25, 1990
INVENTOR(S) : Michael A. Baxter It is certified that error appears in the above-identified patent and that said Letters Patent is hereby corrected as shown below:

Column 7, line 45, after "arrangement" insert -- (discussed by Birkman, et al. in U.S. Pat. No. 4,124,899) --.

Column 7, line 62, "Active" should read --Actively--.

Column 8, line 9, "T11" should read --TP1--.

Column 13, line 40, "$\overline{Q}$" should read --Q--.

Column 20, line 67, "circuits" should read --circuit--.

Column 22, line 27, "gate" should read --gates--.

Signed and Sealed this

Thirteenth Day of October, 1992

*Attest:*

DOUGLAS B. COMER

*Attesting Officer*   Acting Commissioner of Patents and Trademarks